United States Patent [19]
Golla et al.

[11] Patent Number: 5,581,509
[45] Date of Patent: Dec. 3, 1996

[54] DOUBLE-ROW ADDRESS DECODING AND SELECTION CIRCUITRY FOR AN ELECTRICALLY ERASABLE AND PROGRAMMABLE NON-VOLATILE MEMORY DEVICE WITH REDUNDANCY, PARTICULARLY FOR FLASH EEPROM DEVICES

[75] Inventors: Carla M. Golla, Sesto San Giovanni; Marco Olivo, Bergamo, both of Italy

[73] Assignee: SGS-Thomson Microelectronics S.r.l., Agrate Brianza, Italy

[21] Appl. No.: 356,740

[22] Filed: Dec. 15, 1994

[30] Foreign Application Priority Data

Dec. 15, 1993 [EP] European Pat. Off. .............. 93830504

[51] Int. Cl.[6] ...................................................... G11C 7/00
[52] U.S. Cl. ................ 365/200; 365/230.06; 365/185.09
[58] Field of Search ...................................... 365/200, 201, 365/230.03, 230.06, 185.09

[56] References Cited

U.S. PATENT DOCUMENTS 4,584,674 4/1986 Watanabe ........................... 365/230.06
4,852,066 7/1989 Kai ..................................... 365/230.03

FOREIGN PATENT DOCUMENTS 0117903 9/1984 European Pat. Off. .
2569289 2/1986 France .

*Primary Examiner*—Joseph A. Popek
*Attorney, Agent, or Firm*—David V. Carlson; Bryan A. Santarelli; Seed & Berry LLP

[57] ABSTRACT

A double-row address decoding and selection circuitry for an electrically erasable and programmable non-volatile memory device with redundancy comprises a plurality of identical circuit blocks supplied with address signals and each one generating a respective selection signal which is activated by a particular logic configuration of said address signals for the selection of a particular row of the matrix; each one of said circuit blocks also generates a carry-out signal which is supplied to a carry-in input of a following circuit block and is activated when the respective selection signal is activated; a first circuit block of said plurality of circuit blocks has the respective carry-in input connected to a reference voltage; each of said circuit blocks is also supplied with a control signal, which is activated by a control circuitry of the memory device when, during a preprogramming operation preceding an electrical erasure of the memory device, a defective row is addressed, to enable the activation of the respective selection signal if the carry-out signal supplying the respective carry-in input is activated, so that two adjacent rows can be simultaneously selected.

20 Claims, 2 Drawing Sheets

DOUBLE-ROW ADDRESS DECODING AND SELECTION CIRCUITRY FOR AN ELECTRICALLY ERASABLE AND PROGRAMMABLE NON-VOLATILE MEMORY DEVICE WITH REDUNDANCY, PARTICULARLY FOR FLASH EEPROM DEVICES

TECHNICAL FIELD

The present invention relates to a double-row address decoding and selection circuitry for an electrically erasable and programmable non-volatile memory device with redundancy, particularly for Flash EEPROM devices.

BACKGROUND OF THE INVENTION

In the manufacture of semiconductor memories defects are frequently encountered that afflict a limited number of memory elements in the memory matrix. The reason for the high probability of defects of this type resides in that in a semiconductor memory device the greatest part of the chip area is occupied by the memory matrix; moreover, it is in the memory matrix, and not in the peripheral circuitry, that the manufacturing process characteristics are usually pushed to limits.

In order to avoid that the presence of a limited number of defective memory elements on many millions forces the rejection of the entire chip, and therefore to increase the manufacturing process yield, the technique is known of providing for the manufacture of a certain number of additional memory elements, commonly called "redundancy memory elements", to be used as a replacement of those elements that, during testing of the memory device, prove defective; the selection circuits, with which the integrated component must necessarily be provided, and which allow the above-mentioned functional replacement of a defective memory element with a redundancy memory element are indicated as a whole with the name of "redundancy circuitry", while the set of redundancy memory elements and circuitry is defined for short as "redundancy".

The redundancy circuitry comprises programmable non-volatile memory registers suitable to store those address configurations corresponding to the defective memory elements; such registers are programmed once and for all during the memory device testing, and must retain the information stored therein even in absence of the power supply.

In practical implementations of redundancy, both rows ("word lines") and columns ("bit lines") of redundancy memory elements are provided in the memory matrix; each redundancy word line or bit line is associated to a respective non-volatile memory register, wherein the address of a defective word line or bit line is stored so that, whenever the defective word line or bit line is addressed, the corresponding redundancy word line or bit line is selected.

As far as matrix word lines are concerned, it has been recognized that the most frequent defect consists in short-circuits between adjacent word lines: this situation is easily detected during testing because when the selection of one of two short-circuited word lines is attempted, the potential of such word line cannot raise to the designed value, being linked by the short-circuit to the potential of the adjacent non-selected word line. When during testing a matrix word line is found that is short-circuited to an adjacent one, both of the two defective matrix word lines must be replaced by two redundancy word lines; from then on the two defective matrix word lines will never be selected, neither during programming nor during reading.

The implementation of word line redundancy in Flash Electrically Erasable Programmable ROM devices (shortly, Flash EEPROMs) poses some problems. Flash EEPROM devices are characterized by being not only electrically programmable, but also electrically erasable; as EPROM devices, they are programmed on a per-byte basis, raising to a high voltage (typically 12 V) the selected word line; erasing is instead a bulk operation, performed on the whole memory matrix, or at least on sectors of it, by switching the common source line of the memory matrix to the high voltage, while keeping all the word lines to ground. To prevent memory elements which are already in the non-programmed condition from being overerased, with the unacceptable consequence of obtaining, after the erasure, memory elements with negative threshold voltages, it is necessary to carry out a preliminary programming step of all the memory elements in the memory matrix, or in the matrix sector that is to be erased. In this way, all the memory elements are put in a common starting condition, so that after erasure all the memory elements have approximately the same threshold voltage. Such preliminary programming is called "preprogramming" or "preconditioning".

Preprogramming, similarly to normal programming, is performed on a per-byte basis, sequentially addressing the word lines of the memory matrix. This implies that, if defective word lines which have been replaced by redundancy word lines exist, since when such defective word lines are addressed the redundancy circuitry generates a deselection signal that prevents the defective word lines from being selected, the memory elements connected to them can never be preprogrammed; on the other hand, since erasure does not require the selection of the word lines, the memory elements connected to defective word lines are subjected to erasure. This means that, if the traditional word line redundancy approach is utilized in a Flash EEPROM device, the memory elements connected to defective word lines are destined to acquire more and more negative threshold voltages.

To overcome such a problem, the word line redundancy approach utilized in Flash EEPROMs provides for the inhibition of the defective word line deselection signal, generated by the redundancy circuitry, when, during preprogramming, a defective word line is addressed: in this way, when during preprogramming a defective word line is addressed, the memory elements connected to it can be effectively programmed.

This however requires not only the currently addressed defective word line is effectively selected, but also the selection of an adjacent word line: since in fact it is assumed that the defective word line is short-circuited to an adjacent word line, if said adjacent word line is not selected and its potential is kept to ground, the potential of the addressed defective word line cannot raise to the designed value necessary for the programming of the memory elements (12 V); in other words, two adjacent word lines that are short-circuited one to another must be simultaneously selected during preprogramming.

This requirement is responsible of a significant increase in complexity of the word line address decoding and selection circuitry, which means an increase in the overall chip size.

SUMMARY OF THE INVENTION

In view of the state of art described, the object of the present invention is to realize a row address decoding and selection circuitry which allows the simultaneous selection of two adjacent defective word lines during the preprogramming phase, with the minimum increase in the overall chip size.

According to one aspect of the present invention, such object is attained by means of a double-row address decoding and selection circuitry for an electrically erasable and programmable non-volatile memory device with redundancy which comprises a matrix of memory elements located at the intersection of columns and rows of said matrix, comprising a plurality of identical circuit blocks supplied with address signals and each one generating a respective selection signal which is activated by a particular logic configuration of said address signals for the selection of a particular row of the matrix, characterized in that each one of said circuit blocks also generates a carry-out signal which is supplied to a carry-in input of a following circuit block and is activated when the respective selection signal is activated, a first circuit block of said plurality of circuit blocks having the respective carry-in input connected to a reference voltage, each of said circuit blocks being also supplied with a control signal, which is activated by a control circuitry of the memory device when, during a preprogramming operation preceding an electrical erasure of the memory device, a defective row is addressed, to enable the activation of the respective selection signal if the carry-out signal supplying the respective carry-in input is activated, so that two adjacent rows can be simultaneously selected.

The double-row address decoding and selection circuitry according to the present invention allows the simultaneous selection of two adjacent defective rows (word lines) during the preprogramming phase. Furthermore, being made up of a plurality of identical circuital blocks, it is very simple and can be physically realized with a compact layout. The chip size is therefore reduced.

According to another embodiment of the invention, the rows in the matrix are grouped together in packets, said plurality of circuit blocks represents a first-level decoding and selection circuitry which is supplied with first-level row address signals and drives first-level selection means for the selection of a particular row inside each packet, and the double-row address decoding and selection circuitry further comprises a second-level decoding and selection circuitry supplied with second-level row address signals and generating second-level selection signals for the selection of a particular packet of rows.

BRIEF DESCRIPTION OF THE DRAWINGS

The features of the present invention will be made more evident by the following detailed description of its preferred embodiment, illustrated as a non-limiting example in the annexed drawings, wherein.

DETAILED DESCRIPTION OF THE INVENTION

Figure 1:
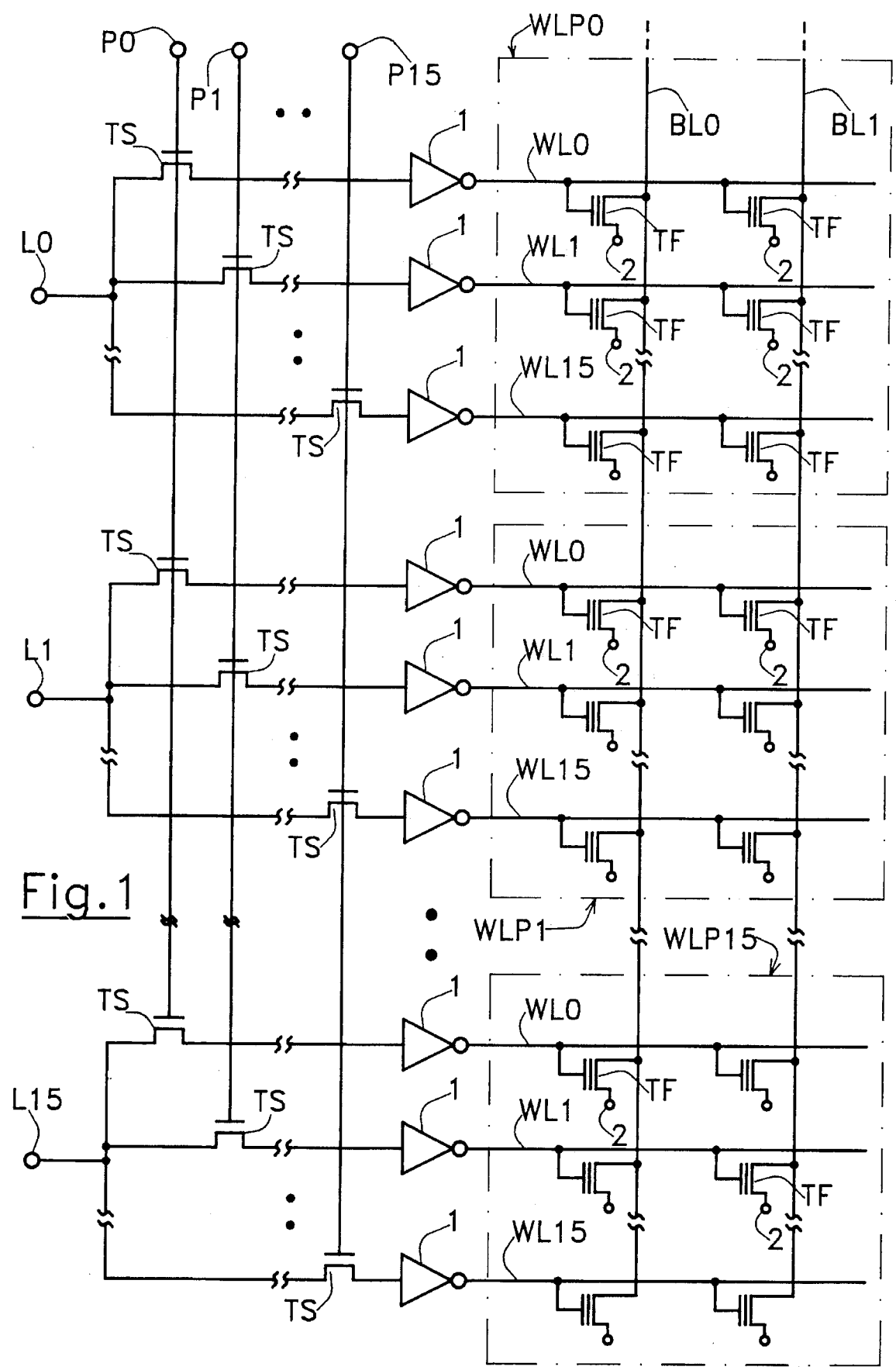
FIG. 1 is an electrical schematic diagram of a part of a matrix of memory elements of an electrically erasable and programmable semiconductor memory device.

As shown in FIG. 1, an electrically erasable and programmable semiconductor memory device, for example of the Flash EEPROM type, comprises a plurality of memory elements TF, represented by stacked-gate MOS transistors having a control gate and a floating gate, located at the intersection of columns or bit lines BL0, BL1 etc. with rows or word lines WL0–WL15, to form a matrix of memory elements TF. Each one of the memory elements TF is connected by its drain to a respective bit line BL0, BL1 etc., and by its control gate to a respective word line WL0–WL15. The sources of all the memory elements TF are connected to a common source line 2.

A per-se known row address decoding and selection architecture, shown in FIG. 1, provides for the existence of groups or "packets" WLP0–WLP15 of an equal number of rows (in the following called "word lines"), in the shown example sixteen packets WLP0–WLP15 of sixteen word lines WL0–WL15 each, for a total of 256 word lines. Each word line WL0–WL15 in each packet WLP0–WLP15 is connected at one end to a driving inverter 1.

Second-level selection signals L0–L15 allow the selection of one packet among all the packets WLP0–WLP15; such signals L0–L15 are generated by a per-se known second-level row address decoding and selection circuitry 8 (FIG. 2) which is supplied by a first subset of the whole set of address signals, represented in the drawing by the address bus ADD; in the shown example, four address signals are necessary to generate the sixteen signals L0–L15. To select a given packet WLP0–WLP15 of word lines, let's say WLP0, the respective second-level selection signal L0 is driven to the low logic level, while all the other signals L1–L15 are kept high.

First-level selection signals P0–P15 drive respective selection transistors TS connected to the input of the driving inverters 1, and allow the selection of a given word line among all the word lines WL0–WL15 of a given packet WLP0–WLP15: if for example the word line WL0 in the packet WLP0 is to be selected, L0 is driven low and P0 is driven high, so that a logic "0" is supplied to the input of the respective driving inverter 1: the potential of the word line WL0 is thus raised to the value of the voltage supply of the inverters 1; this voltage can be switched between the normal 5 V voltage supply (in reading condition) and a programming high voltage of about 12 V (in programming condition); all the other signals P1–P15 are kept low so that the respective selection transistor TS is kept off; the input of the driving inverters 1 is therefore left floating; since however the driving inverters 1 are provided with an internal pull-up to the voltage supply of the inverters 1, the potential of the non-selected word lines WL1–WL15 is kept low.

Figure 2:
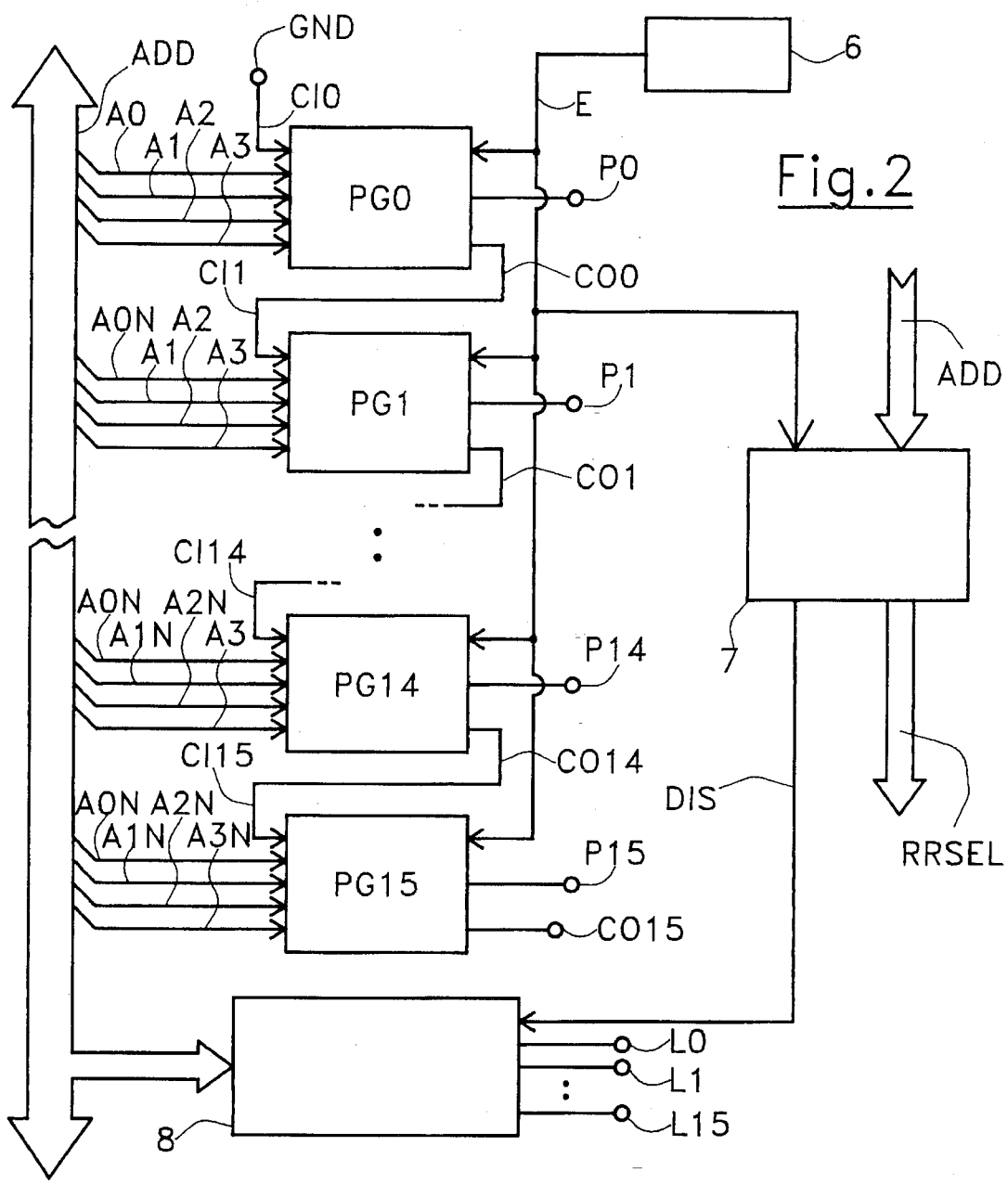
FIG. 2 is a schematic block diagram of a double-row address decoding and selection circuitry according to one aspect of the invention.

As shown in FIG. 2, the circuit of the present invention generates the first-level selection signals P0–PO15 by a first-level row address decoding circuitry comprising a number of similar blocks PG0–PG15, each one generating a respective signal P0–P15. Said circuitry performs a decoding of a second subset of the whole set of address signals ADD: each block PG0–PG15 is supplied with a different combination of signals, taken from the address bus ADD, wherein each signal represents one address signal A0–A3 or its logic complement A0N–A3N. Each block PG0–PG15 is also supplied by a carry-in signal CI0–CI15 connected to a carry-out signal CO0–CO15 of a preceding block or, in the case of the first block PG0, connected to a ground voltage line GND. The carry-out signal CO15 of the sixteenth block PG15 is instead left floating. All the blocks PG0–PG15 are further supplied with a preprogramming enable signal E activated by a control circuitry 6 internal to the memory device, as will be explained in the following.

Figure 3:
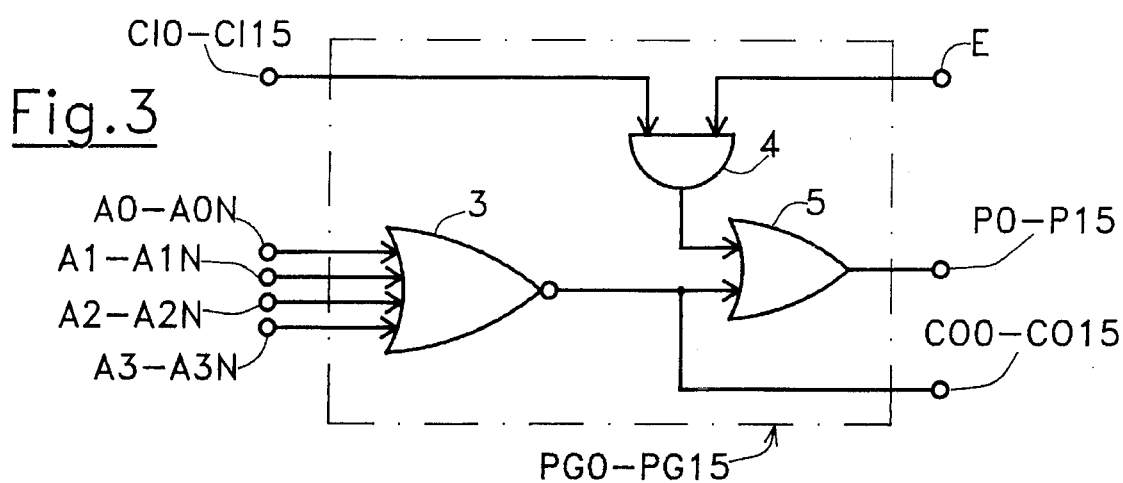
FIG. 3 is an electrical schematic diagram of one block of the circuitry of FIG. 2.

As shown in FIG. 3, in one embodiment, each block PG0–PG15 comprises a four-input NOR gate 3 supplied by the respective combination of address signals A0,A0–NA3, A3N; an output of the NOR gate 3 constitutes both the carry-out signal CO0–CO15 of the block and a first input of a two-input OR gate 5 whose second input is supplied by an AND gate 4 which has a first input supplied by the signal E, and a second input supplied by a respective carry-in signal CI0–CI15; the OR gate 5 generates one of the signals P0–P15. Alternatively, each block PG0–PG15 may be any suitable row address decoding circuitry, of a type known in the art.

The output of the decoding circuitry is supplied as an input to decoding circuitry for an adjacent word line. This input is then used to ensure selection of two adjacent defective word lines during the preprogramming phase. One example of how this signal is used is shown in FIG. 2, another specific example is shown in FIG. 3 and other equivalent logic configurations may also be used.

The memory device is also provided with a redundancy circuitry 7 (FIG. 2) for the selection of redundancy word lines in substitution of defective word lines. The redundancy circuitry 7 supplies the second-level row address decoding and selection circuitry 8 with a signal DIS which is activated when the memory device is operated in normal reading or programming condition and a defective word line is addressed. The redundancy circuitry 7 is further supplied by the control circuitry 6 with the signal E.

If for example during testing the word line WL0 of the packet WLP1 is found to be short-circuited with the adjacent word line WL1 of the same packet WLP1, the two word lines WL0 and WL1 of the packet WLP1 are replaced by two redundancy word lines (not shown), the address configuration of the two short-circuited word lines being programmed into two non-volatile memory registers included in the redundancy circuitry 7 and associated to said two redundancy word lines. The proper address of the redundancy word lines is output on the redundancy word line selection bus, RRSEL. From then on, provided that the memory device is operated either in normal reading or programming conditions, any attempt to address either one of the two short-circuited word lines WL0, WL1 of the packet WLP1 will be recognized by the redundancy circuitry 7; this will prevent the addressed defective word line from being selected, by activating the signal DIS which supplies the second-level row address decoding and selection circuitry 8, to prevent the second-level selection signals L0–L15 from being activated, and will instead enable the selection of the corresponding redundancy word line on RRSEL. In this way, data are neither read from or programmed into the memory elements TF of the defective word lines WL0, WL1, but are instead read from or programmed into the memory elements TF of the corresponding redundancy word lines.

When, differently, the memory device must be erased, all the memory elements TF, including all redundancy memory elements as well as the memory elements TF belonging to the defective word lines WL0 and WL1 of packet WLP1, must be preprogrammed. This operation can be controlled externally by a microcontroller, or internally by the control circuitry 6 of the memory device: in the first case, the microcontroller must put the memory device in the erase mode, and then sequentially supply to the memory device all the possible address configurations; in the second case, the microcontroller must just put the memory device in the erase mode: the internal control circuitry 6 will carry out the preprogramming operation by generating internally all the possible address configurations.

In both cases, as long as non-defective word lines are addressed, the internal control circuitry 6 keeps the preprogramming enable signal E low, so that in each block PG0–PG15 the second input of the OR gate 5 is kept low independently of the logic state of the respective carry-in signals CI0–CI15; this causes only one of the signals P0–P15 generated by each of the blocks PG0–PG15 to be activated at a time when the exact configuration of address signals A0,AON–A3,A3N is supplied to the respective block.

When however the first defective word line is addressed, in our example WL0 in WLP1, the signal E is activated by the control circuitry 6, indicating that preprogramming is occurring to prevent the signal DIS generated by the redundancy circuitry 7 from being activated: in this way the second-level selection signal L1 can be driven low. Due to the activation of the signal E, in each block PG0–PG15 the logic level of the signal P0–P15 not only depends on the address configuration currently supplied to the memory device, but also on the logic state of the carry-in signal CI0–CI15 supplied to the block, i.e. on the logic state of the carry-out signal CO0–CO15 of the preceding block: in our example, when the word line packet WLP1 is addressed, and A0=Ai=A2=A3="0", the output CO0 of the NOR gate 3 in the block PG0 is a logic "1", P0 is driven high and causes the logic present on L1 to be transferred to the input of the driving inverter 1; this in turn puts the programming high voltage on the selected word line WL0; since the signal CO0 also represents the carry-in signal CI1 of the following block PG1, and since the signal E is activated, one input of the OR gate 5 of the block PG1 is a logic "1" even if the current configuration of the address bits AON, A1–A3 does not activate the output of the NOR gate 3 of PG1; in this way also P1 is driven high, and the defective word line WL1 of WLP1 is also connected to the programming high voltage. As a result, addressing the defective word line WL0 in WLP1 causes the short-circuited word line WL1 to be simultaneously selected.

In the embodiment of FIG. 2, the first row line decoding circuitry PG0 of each packet has its input grounded and the output of the last row line decoding circuitry PG15 of each packet has its output unconnected to any circuit. Thus, the first row line of each packet is linked to an adjacent row line within the same packet. This can be modified, if desired.

Control circuitry 6 and redundancy circuitry 7 are known circuit elements in the prior art. According to the invention, such known circuitry 6 is modified slightly to generate, along with its standard preprogramming signals, a preprogramming enable signal E to indicate that preprogramming is occurring. This can be achieved by providing another output from preprogram control circuitry within control circuit 6, by connecting a buffer, inverter, or suitable logic to the preprogram control circuitry, or other acceptable technique.

This enable signal E is input to the redundancy circuit 7 to disable generating the signal DIS and to the row address decoding circuitry, as shown in FIG. 2. Any suitable circuit is acceptable to disable DIS, for example, a simple two input NOR gate with E and $\overline{DIS}$ as inputs is acceptable in the circuit 7; an RS flip-flop with E as the reset input, or many other simple logic combinations for E to prevent DIS from being generated even when a defective, row line address is on the ADD bus. The signal E is not generated during normal reading or writing, so the defective word lines are not addressed at these times. It is generated during preprogramming to permit preprogramming of the memory cells on a defective word line.

While various embodiments have been described in this application for illustrative purposes, the claims are not limited to these embodiments. Many modifications can be made to the structures shown and described herein that take advantage of the present invention and fall within the scope of the claims. For example, some circuits can be substituted for those disclosed and claimed herein to achieve this invention.

We claim:

1. Double-row address decoding and selection circuitry for an electrically erasable and programmable non-volatile memory device with redundancy which comprises a matrix of memory elements located at the intersection of columns and rows of said matrix, comprising a plurality of identical circuit blocks supplied with address signals and each one generating a respective selection signal which is activated by a particular logic configuration of said address signals for the selection of a particular row of the matrix, characterized in that each one of said circuit blocks also generates a carry-out signal which is supplied to a carry-in input of a following circuit block and is activated when the respective selection signal is activated, a first circuit block of said plurality of circuit blocks having the respective carry-in input connected to a reference voltage, each of said circuit blocks being also supplied with a control signal, which is activated by a control circuitry of the memory device when, during a preprogramming operation preceding an electrical erasure of the memory device, a defective row is addressed, to enable the activation of the respective selection signal if the carry-out signal supplying the respective carry-in input is activated, so that two adjacent rows can be simultaneously selected.

2. Double-row address decoding and selection circuitry according to claim 1, the rows in the matrix being grouped together in packets, characterized in that said plurality of circuit blocks represents a first-level row address decoding circuitry which is supplied with first-level row address signals and drives first-level selection means for the selection of a particular row inside each packet, said plurality of circuit blocks comprising a second-level row address decoding and selection circuitry supplied with second-level row address signals and generating second-level selection signals for the selection of a particular packet.

3. Double-row address decoding and selection circuitry according to claim 2, characterized in that each of said plurality of circuit blocks comprises a first logic gate supplied with a respective combination of signals of said first-level row address signals, the output of the first logic gate being activated when said combination of signals is in a particular logic condition and supplying a first input of a second logic gate whose second input is supplied by the output of a third logic gate which is activated when both the control signal and the respective carry-in signal are activated, the output of the second logic gate representing the selection signal of the circuit block, the output of the first logic gate also representing the carry-out signal of said circuit block.

4. Double-row address decoding and selection circuitry according to claim 2, characterized in that said second-level row address decoding and selection circuitry is supplied by an inhibition signal activated by a redundancy circuitry of the memory device when a defective row is currently addressed to prevent the activation of said second-level selection signals, the redundancy circuitry being supplied by said control signal which prevent, when activated, the activation of said inhibition signal.

5. A memory device, comprising:

an address bus operable to receive an address;

a first plurality of memory cells that are each operable to store data;

a control circuit that generates an enable signal; and a plurality of row selection circuits having a carry-in terminal, a carry-out terminal, and a preprogramming enable input terminal, the carry-in terminal being coupled to a carry-out terminal of a preceding row selection and the preprogramming active input terminal being coupled to the control circuit for permitting selection of two row lines upon generation of the enable signal.

6. The memory device of claim 5, further comprising:

said address bus having first- and second-level address sections;

a second plurality of memory cells arranged in rows;

a second-level decoder operable to select said first plurality of memory cells when a first address occupies said second-level address section and to select said second plurality when a second address occupies said second-level address section; and each of said circuit blocks operable to be addressed when an associated address occupies said first-level address section.

7. The memory device of claim 6, further comprising:

redundancy-memory rows operable to replace defective ones of said memory rows;

a redundancy circuit operable to generate a disable signal that disables said second-level decoder when a defective memory row is addressed except when said control circuit generates said enable signal.

8. The memory device of claim 5 wherein each of said circuit blocks comprises:

a first gate for generating said first carry-out signal when said each row selection circuit is addressed;

a second gate for generating a carry-select signal when said second carry-out signal and said enable signal are generated; and a third gate for generating a row selection signal when said first carry-out signal or said carry-select signal are generated.

9. The memory device of claim 5 wherein a carry-in terminal of the first row selection circuit, within said plurality of row selection circuits, is coupled to a reference voltage.

10. The memory device of claim 9 wherein a carry-in terminal of the last row selection circuit, within said plurality of row selection circuits, is unconnected.

11. A method comprising:

selecting with an address a memory row;

generating a carry-out signal;

generating an enable signal; and simultaneously selecting an adjacent memory row with said carry-out and enable signals.

12. The method of claim 11, further comprising:

selecting with a second level section of said address a packet of memory rows that includes said row and said succeeding row; and selecting said row with a first-level section of said address.

13. The memory device of claim 12, further comprising:

replacing defective ones of said memory rows with redundancy memory rows; and generating a disable signal that inhibits said selecting of said packet when a defective memory row is addressed except when said enable signal is generated.

14. A method comprising:

selecting with an address a memory row;

generating a carry-in signal;

generating a carry-out signal;

generating an enable signal;

simultaneously selecting a succeeding memory row with said carry-in, carry-out and enable signals;

ANDing said carry-in signal and said enable signal to generate a carry-select signal; and ORing said carry-out signal and said carry-select signal to generate a row selection signal that selects said succeeding row.

15. The method of claim 14 wherein said succeeding row is adjacent to said row.

16. A programmable and erasable memory device, comprising:

an address bus having first- and second-level address sections;

packets of word lines of non-volatile memory elements that are each operable to store a programmed data value;

a control circuit for generating an enable signal during a preprogramming mode during which said memory elements are preprogrammed;

a second-level decoder in communication with said address bus and said packets and operable to generate a second-level selection signal to select one of said packets when an associated address occupies said second-level address section; and first-level circuit blocks each in communication with said address bus, said control circuit, and said packets, and each having carry-in and carry-out terminals, the carry-in terminals of all but a first block each coupled to the carry-out terminal of a preceding block, each block operable to generate a first-level selection signal to select one of said word lines from a selected packet and to generate a first carry-out signal on said carry-out terminal when an associated address occupies said first-level address section, and to generate said first-level selection signal when said control circuit and said preceding block respectively generate said enable signal and a second carry-out signal.

17. The memory device of claim 16, further comprising:

redundancy wordlines of redundancy memory elements operable to replace defective ones of said wordlines;

a redundancy circuit in communication with said second-level decoder and said control circuit, and operable to receive said enable signal and to generate a disable signal that disables said second-level decoder when an address associated with a defective wordline occupies said first-level address section, wherein said enable signal inhibits said redundancy circuit from generating said disable signal during said preprogramming mode.

18. The memory device of claim 16 wherein each of said circuit blocks comprises:

a NOR gate in communication with said first-level address section and operable to generate said first carry-out signal when said associated address occupies said first-level address section;

an AND gate in communication with said control circuit and said carry-in terminal and operable to generate a carry-select signal when said second carry-out signal and said enable signal are generated; and an OR gate in communication with said AND and NOR gates and operable to generate said first-level selection signal when said first carry-out signal or said carry-select signal are generated.

19. The memory device of claim 16 wherein the carry-in terminal of said first block is coupled to a reference voltage.

20. The memory device of claim 19 wherein the carry-out terminal of a last block is unconnected.

* * * * *

UNITED STATES PATENT AND TRADEMARK OFFICE
CERTIFICATE OF CORRECTION

PATENT NO. : 5,581,509
DATED : December 3, 1996
INVENTOR(S) : Carla M. Golla et al.

It is certified that error appears in the above-indentified patent and that said Letters Patent is hereby corrected as shown below:

In column 8, claim 8, line 31, please delete "circuit blocks" and insert therefor --plurality of row selection circuits--.

Signed and Sealed this

Thirtieth Day of September, 1997

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO.     :  5,581,509
DATED          :  December 3, 1996
INVENTOR(S)    :  Carla M. Gola and Marco Olivo It is certified that error appears in the above identified patent and that said Letters Patent is hereby corrected as shown below:

In column 8, claim 5, line 6, please delete "active" and insert therefore -- enable --.

In column 8, claim 13, line 61, please delete "memory device" and insert therefore -- method --.

Signed and Sealed this

First Day of September, 1998

*Attest:*

BRUCE LEHMAN

*Attesting Officer*     *Commissioner of Patents and Trademarks*